(12) United States Patent
Kubota et al.

(10) Patent No.: US 6,327,206 B2
(45) Date of Patent: Dec. 4, 2001

(54) SEMICONDUCTOR MEMORY DEVICE INCLUDING SERIAL/PARALLEL CONVERSION CIRCUIT

(75) Inventors: Norihiko Kubota; Sadao Yoshikawa, both of Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/816,609

(22) Filed: Mar. 23, 2001

(30) Foreign Application Priority Data

Mar. 27, 2000 (JP) .................................................. 12-085824

(51) Int. Cl.[7] ...................................................... G11C 7/00
(52) U.S. Cl. ............................ 365/219; 365/220; 365/221
(58) Field of Search .................................... 365/219, 220, 365/221, 189.01, 230.06, 230.08

(56) References Cited

U.S. PATENT DOCUMENTS 5,412,610 * 5/1995 Suzuki ................................. 365/219

* cited by examiner

Primary Examiner—David Nelms
Assistant Examiner—David Lam
(74) Attorney, Agent, or Firm—Sheridan Ross P.C.

(57) ABSTRACT

A semiconductor memory device having a reduced circuit area. The semiconductor memory device includes a memory cell array connected to an address decoder, a sense amplifier, a write amplifier, and a command decoder. A first serial/parallel converter is adjacent to the address decoder. A parallel/serial converter is adjacent to the sense amplifier. A second serial/parallel converter is adjacent to the write amplifier. A third serial/parallel converter is adjacent to the command decoder. The serial/parallel converters and the parallel/serial converter are each connected to an input/output circuit via a pair of wires.

4 Claims, 1 Drawing Sheet

SEMICONDUCTOR MEMORY DEVICE INCLUDING SERIAL/PARALLEL CONVERSION CIRCUIT

BACKGROUND OF THE INVENTION

The present invention relates to a semiconductor memory device, and more particularly, to a semiconductor memory that inputs and outputs multiple bit data in a serial manner.

A semiconductor memory device has a serial interface to transfer memory data and address data in a serial manner between the semiconductor memory device and an external device. A semiconductor memory device that performs such serial transfer has a relatively small number of data input/output (I/O) terminals and is thus compact. However, it takes time for such semiconductor memory device to input and output data.

FIG. 1 is a schematic block diagram of a prior art semiconductor memory device 10. A memory cell array 1 includes a plurality of memory cells, which are arranged in a matrix-like manner, and selection circuits, each of which is provided for each row and each column to selectively activate each memory cell. The address decoder 2 responds to parallel address data AD-P having a predetermined number of bits and selectively activates certain rows and columns in the memory cell array 1. A sense amplifier 3 is connected to each row of the memory cell array 1 to generate parallel read data RD-P from the data stored in the activated memory cell. A write amplifier 4 is connected to each column of the memory cell array 1 to write data to the activated memory cell.

A command decoder 5 controls the memory cell array 1 in response to command data CC-P. For example, when the command data CC-P instructs data reading, the command decoder 5 operates the memory cell array 1 in a read mode and connects the activated memory cell to the sense amplifier 3. Further, when the command data CC-P instructs data writing, the command decoder 5 operates the memory cell array 1 in a write mode and connects the activated memory cell to the write amplifier 4. The command decoder 5 may also set the deletion unit of the memory cells and the switch the number of bits of the stored data.

A data converter 6 converts serial address data AD-S, which is provided from an input/output (I/O) circuit 7, to the parallel address data AD-P and provides the parallel address data AD-P to the address decoder 2. In the read mode, the data converter 6 converts the parallel read data RD-P, which is provided from the sense amplifier 3, to serial read data RD-S and provides the read data RD-S to the I/O circuit 7. In the write mode, the data converter 6 converts serial write data WD-S to parallel write data WD-P and provides the parallel write data WD-P to the write amplifier 4. Further, the data converter 6 converts serial command data CC-S, which is provided from the I/O circuit 7, to parallel command data CC-P and provides the parallel command data CC-P to the command decoder 5. The I/O circuit 7 is connected to the data converter 6 and transfers the read data RD-S, the write data WD-S, the address data AD-S, and the command data CC-S between the data converter 6 and an external device (not shown).

The memory cell array 1, the address decoder 2, the sense amplifier 3, the write amplifier 4, the command decoder 5, the data converter 6, and the I/O circuit 7 are fabricated on a semiconductor substrate. Further, the I/O circuit 7 has I/O terminals connecting the semiconductor memory device 10 to an external device. The input terminals receive each piece of data one bit at a time in a serial manner. Accordingly, the number of terminals need not be increased even if the number of bits in each piece of address data or stored data increases.

The data converter 6 is connected to the I/O circuit 7 by wires, the number of which is required to transfer one bit of data. The data converter 6 is further connected to the address decoder 2, the sense amplifier 3, the write amplifier 4, and the command decoder 5 by wires, the number of which corresponds to the number of bits in each piece of data. An increase in the capacity of the memory cell array 1 increases the distance from the data converter 6 to the address decoder 2, the sense amplifier 3, the write amplifier 4, or the command decoder 5. This lengthens the wires connecting the data converter 6 to the address decoder 2, the sense amplifier 3, the write amplifier 4, and the command decoder 5. Further, these wires, the number of which corresponds to the number of bits in each piece of data, are arranged in parallel. This increases the area occupied by the wires. An increase in the wiring area enlarges the integrated circuit chip and restricts the layout of circuits on the chip.

SUMMARY OF THE INVENTION

It is an object of the present invention to provide a semiconductor memory device having reduced wiring area.

To achieve the above object, the present invention provides a semiconductor memory device including a memory cell array having a plurality of memory cells arranged in a matrix-like manner. An address decoder is connected to the memory cell array to selectively activate a certain memory cell in the memory cell array based on parallel address data. A sense amplifier generates parallel read data from data stored in the activated memory cell. An input/output circuit receives serial address data and outputs serial read data. A first serial/parallel converter is connected between the address decoder and the input/output circuit to convert the serial address data, which is received from the input/output circuit, to parallel address data and provide the parallel address data to the address decoder. The first serial/parallel converter is adjacent to the address decoder. A parallel/serial converter is connected between the sense amplifier and the input/output circuit to convert the parallel read data, which is received from the sense amplifier, to the serial read data and provide the serial read data to the input/output circuit. The parallel/serial converter is adjacent to the sense amplifier.

The present invention further provides a semiconductor memory device including a memory cell array having a plurality of memory cells arranged in a matrix-like manner. An input/output circuit receives serial address data, serial command data, and serial write data and outputs serial read data. An address decoder is connected to the memory cell array for selectively activating a memory cell in the memory cell array based on parallel address data. A first serial/parallel converter is connected between the input/output circuit and the address decoder to convert the serial address data, which is received from the input/output circuit, to the parallel address data and provide the parallel address data to the address decoder. The first serial/parallel converter is adjacent to the address decoder. A sense amplifier generates parallel read data from data stored in the activated memory cell. A parallel/serial converter is connected between the input/output circuit and the sense amplifier to convert the parallel read data, which is received from the sense amplifier, to the serial read data and provide the serial read data to the input/output circuit. The parallel/serial converter is adjacent to the sense amplifier. A command decoder is connected to the memory cell array to control the memory cell array based on parallel command data. A second serial/parallel converter is connected between the input/output circuit and the command decoder to convert the serial command data, which is received from the input/output circuit, to the parallel command data and provide the parallel command data to the command decoder. The second serial/parallel converter is adjacent to the command decoder. A write amplifier receives parallel write data and writes data to the memory cell activated by the address decoder. A third serial/parallel converter is connected between the write amplifier and the input/output circuit to convert the serial write data, which is received from the input/output circuit, to the parallel write data and provide the parallel write data to the write amplifier. The third serial/parallel converter is adjacent to the write amplifier.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 2:
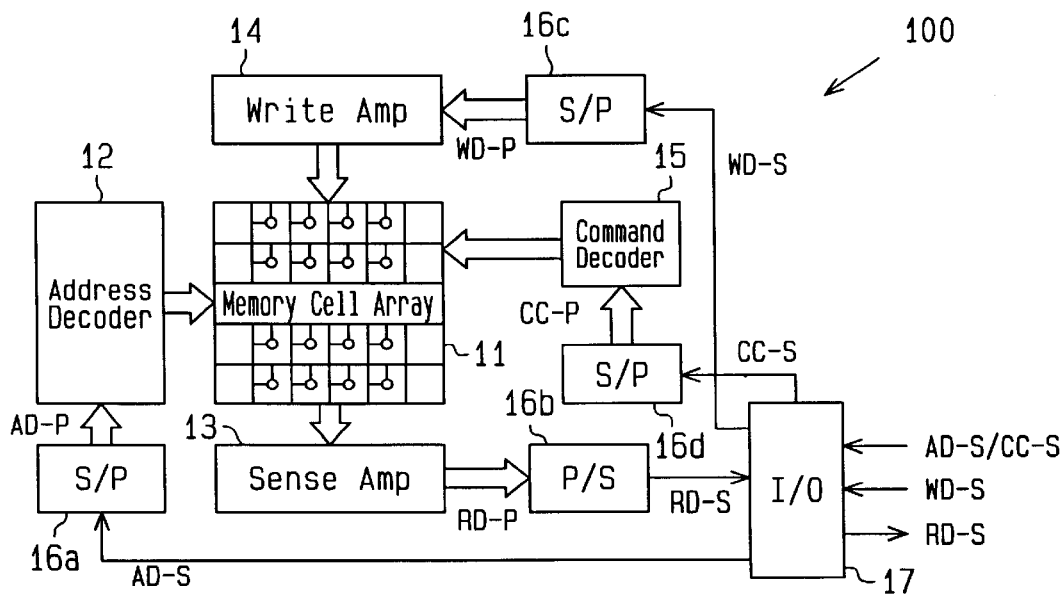
FIG. 2 is a schematic block diagram of a semiconductor memory device according to a preferred embodiment of the present invention.

A semiconductor memory device 100 according to a preferred embodiment of the present invention will now be described with reference to FIG. 2. The semiconductor memory device is connected to an external device (not shown) and operated based on control information (AD-S, CC-S). The semiconductor memory device 100 includes a memory cell 11, an address decoder 12, a sense amplifier 13, a write amplifier 14, a command decoder 15, a first serial/parallel converter 16a, a parallel/serial converter 16b, a second serial/parallel converter 16c, a third serial/parallel converter 16d, and an input/output (I/O) circuit 17.

Figure 1:
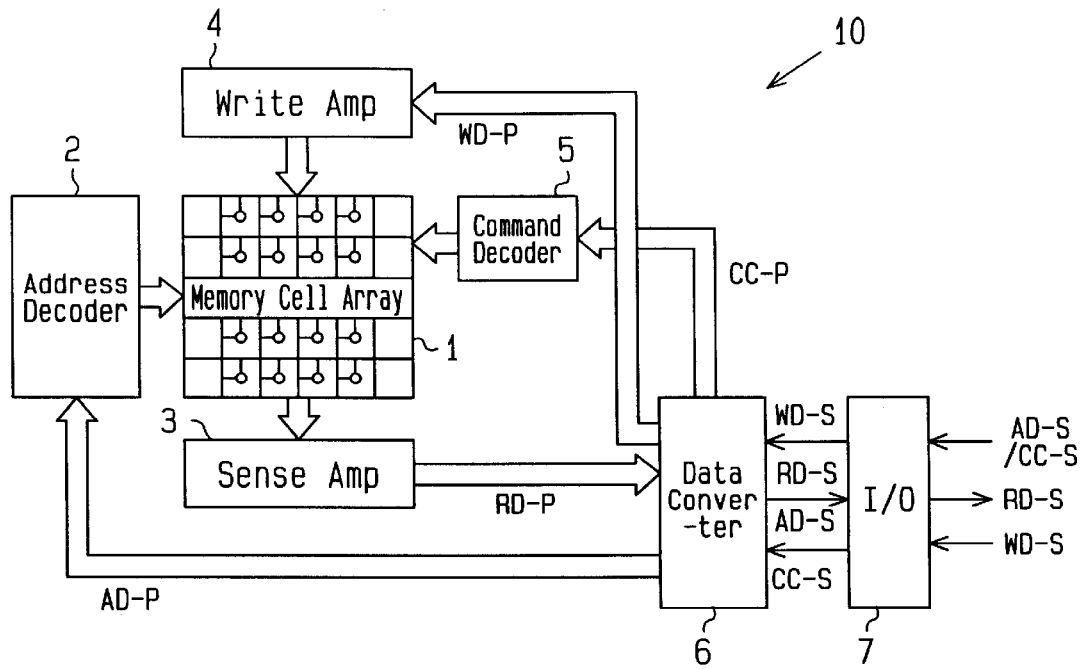
FIG. 1 is a schematic block diagram of a prior art memory device.

The memory cell array 11 includes a plurality of memory cells, which are arranged in a matrix-like manner, and selection circuits, each of which is provided for each row and each column to selectively activate each memory cell. The address decoder 12 responds to parallel address data AD-P and selectively activates certain rows and columns in the memory cell array 11. The sense amplifier 13 is connected to each row of the memory cell array 11 to generate parallel read data RD-P from the data stored in the activated memory cell. The write amplifier 14 is connected to each column of the memory cell array 11 to write data to the memory cells. The memory cell array 11, the address decoder 12, the sense amplifier 13, and the write amplifier 14 are similar to the corresponding memory cell array 1, address decoder 2, sense amplifier 3, and write amplifier 14 of FIG. 1.

The command decoder 15 controls the memory cell array 11 in response to parallel command data CC-P. For example, when the command data CC-P instructs data reading, the command decoder 15 operates the memory cell array 11 in a read mode and connects the activated memory cell to the sense amplifier 13. Further, when the command data CC-P instructs data writing, the command decoder 15 operates the memory cell array 11 in a write mode and connects the activated memory cell to the write amplifier 14.

The first serial/parallel converter 16a, which is preferably arranged adjacent to the address decoder 12, converts serial address data AD-S to parallel address data AD-P and provides the parallel address data AD-P to the address decoder 12. In the read mode, the parallel/serial converter 16b, which is preferably arranged adjacent to the sense amplifier 13, converts parallel read data RD-P, which is provided from the sense amplifier 13, to serial read data RD-S and provides the serial read data RD-S to the I/O circuit 17.

The second serial/parallel converter 16c, which is preferably arranged adjacent to the write amplifier 14, converts serial write data WD-S to parallel write data WD-P and provides the parallel write data WD-P to the write amplifier 14.

The third serial/parallel converter 16d, which is preferably arranged adjacent to the command decoder 15, converts serial command data CC-S to parallel command data CC-P and provides the parallel command data CC-P to the command decoder 15.

The I/O circuit 17 is connected to the first, second, and third serial/parallel converters 16a, 16c, 16d and the parallel/serial converter 16b. The I/O circuit 17 receives the serial address data AD-S, the serial write data WD-S, and the serial command data CC-S from an external device and respectively provides the serial address data AD-S, the serial write data WD-S, and the serial command data CC-S to the serial/parallel converters 16a, 16c, 16d. The I/O circuit 17 receives the serial read data RD-S from the parallel/serial converter 16b and directly provides the serial read data RD-S to the external device. The serial/parallel converters 16a, 16c, 16d and the parallel/serial converter 16b are each connected to the I/O circuit 17 by a single pair of wires regardless of the number of bits in each piece of data.

When fabricating the semiconductor memory device 100 on a semiconductor substrate, the serial/parallel converters 16a, 16c, 16d are respectively arranged adjacent to the address decoder 12, the write amplifier 14, and the command decoder 15. Further, the parallel/serial converter circuit 16b is arranged adjacent to the sense amplifier 13. Thus, even if the address decoder 12, the sense amplifier 13, the write amplifier 14, and the command decoder 15 are separated from the I/O circuit 17, the converters 16a–16d are each connected to the I/O circuit 17 by a pair of relatively fine wires. Thus, the wiring area is not increased.

The semiconductor memory device 100 of the preferred and illustrated embodiment reduces the wiring area. Thus, the semiconductor memory device 100 has a relatively small circuit area. This enables circuits to be laid out with fewer restrictions when fabricating the semiconductor memory device 100. This feature is especially advantageous when the semiconductor memory device 100 has a large capacity and the memory cell array is large.

In addition to the semiconductor memory device 100 of the preferred and illustrated embodiment, the present invention may be applied to a semiconductor device having read only memory cells or non-volatile memory cells. When applying the present invention to a semiconductor device having read only memory cells, the write amplifier 14 and the second serial/parallel converter 16c are not required.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A semiconductor memory device comprising:
a memory cell array having a plurality of memory cells arranged in a matrix-like manner;
an address decoder connected to the memory cell array for selectively activating a certain memory cell in the memory cell array based on parallel address data;
a sense amplifier for generating parallel read data from data stored in the activated memory cell;
an input/output circuit for receiving serial address data and outputting serial read data;
a first serial/parallel converter connected between the address decoder and the input/output circuit for converting the serial address data received from the input/output circuit to parallel address data and providing the parallel address data to the address decoder, wherein the first serial/parallel converter is adjacent to the address decoder; and
a parallel/serial converter connected between the sense amplifier and the input/output circuit for converting the parallel read data received from the sense amplifier to the serial read data and providing the serial read data to the input/output circuit, wherein the parallel/serial converter is adjacent to the sense amplifier.

2. The semiconductor memory device according to claim 1, further comprising:
a command decoder connected to the memory cell array for controlling the memory cell array based on parallel command data; and
a second serial/parallel converter connected between the command decoder and the input/output circuit for converting serial command data received from the input/output circuit to the parallel command data and providing the parallel command data to the command decoder, wherein the second serial/parallel converter is adjacent to the command decoder.

3. The semiconductor memory device according to claim 1, wherein the input/output circuit receives serial write data, the semiconductor memory device further comprising:
a write amplifier for receiving parallel write data and writing data to the memory cell activated by the address decoder; and
a third serial/parallel converter connected between the write amplifier and the input/output circuit for converting the serial write data received from the input/output circuit to the parallel write data and providing the parallel write data to the write amplifier, wherein the third serial/parallel converter is adjacent to the write amplifier.

4. A semiconductor memory device comprising:
a memory cell array having a plurality of memory cells arranged in a matrix-like manner;
an input/output circuit for receiving serial address data, serial command data, and serial write data and outputting serial read data;
an address decoder connected to the memory cell array for selectively activating a memory cell in the memory cell array based on parallel address data;
a first serial/parallel converter connected between the input/output circuit and the address decoder for converting the serial address data received from the input/output circuit to the parallel address data and providing the parallel address data to the address decoder, wherein the first serial/parallel converter is adjacent to the address decoder;
a sense amplifier for generating parallel read data from data stored in the activated memory cell;
a parallel/serial converter connected between the input/output circuit and the sense amplifier for converting the parallel read data received from the sense amplifier to the serial read data and providing the serial read data to the input/output circuit, wherein the parallel/serial converter is adjacent to the sense amplifier;
a command decoder connected to the memory cell array for controlling the memory cell array based on parallel command data;
a second serial/parallel converter connected between the input/output circuit and the command decoder for converting the serial command data received from the input/output circuit to the parallel command data and providing the parallel command data to the command decoder, wherein the second serial/parallel converter is adjacent to the command decoder;
a write amplifier for receiving parallel write data and writing data to the memory cell activated by the address decoder; and
a third serial/parallel converter connected between the write amplifier and the input/output circuit for converting the serial write data received from the input/output circuit to the parallel write data and providing the parallel write data to the write amplifier, wherein the third serial/parallel converter is adjacent to the write amplifier.

* * * * *

UNITED STATES PATENT AND TRADEMARK OFFICE
CERTIFICATE OF CORRECTION

PATENT NO. : 6,327,206 B2
DATED : March 23, 2001
INVENTOR(S) : Norihiko Kubota

It is certified that error appears in the above-identified patent and that said Letters Patent is hereby corrected as shown below:

<u>Title page,</u>
Item [30], should read:

-- [30]     Foreign Application Priority Data

Mar. 27, 2000        (JP) ………………………..2000-085824 --

Signed and Sealed this

Eighth Day of October, 2002

*Attest:*

*Attesting Officer*

JAMES E. ROGAN
*Director of the United States Patent and Trademark Office*